United States Patent
Lin et al.

(10) Patent No.: US 11,817,470 B2
(45) Date of Patent: Nov. 14, 2023

(54) STACKED SUBSTRATE STRUCTURE WITH INTER-TIER INTERCONNECTION

(71) Applicant: Taiwan Semiconductor Manufacturing Company, Ltd., Hsin-Chu (TW)

(72) Inventors: Jeng-Shyan Lin, Tainan (TW); Dun-Nian Yaung, Taipei (TW); Jen-Cheng Liu, Hsin-Chu (TW); Hsun-Ying Huang, Tainan (TW); Wei-Chih Weng, Tainan (TW); Yu-Yang Shen, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 154 days.

(21) Appl. No.: 17/349,120

(22) Filed: Jun. 16, 2021

(65) Prior Publication Data

US 2021/0313376 A1    Oct. 7, 2021

Related U.S. Application Data

(63) Continuation of application No. 16/167,810, filed on Oct. 23, 2018, now Pat. No. 11,043,522, which is a
(Continued)

(51) Int. Cl.
*H01L 27/146* (2006.01)
*H01L 23/48* (2006.01)
(Continued)

(52) U.S. Cl.
CPC .. *H01L 27/14634* (2013.01); *H01L 21/76898* (2013.01); *H01L 21/78* (2013.01);
(Continued)

(58) Field of Classification Search
CPC ............. H01L 23/481; H01L 21/76898; H01L 25/0657

See application file for complete search history.

(56) References Cited

U.S. PATENT DOCUMENTS

| 9,276,104 B2 | 3/2016 | Tsunemi et al. |
| 2007/0207592 A1* | 9/2007 | Lu ........................... H01L 24/83 |
| | | 438/455 |

(Continued)

FOREIGN PATENT DOCUMENTS

| CN | 103579103 A | 2/2014 |
| JP | 2001339057 A | 12/2001 |

(Continued)

OTHER PUBLICATIONS

Non-Final Office Action dated Nov. 21, 2017 for U.S. Appl. No. 15/365,064.

(Continued)

*Primary Examiner* — Raj R Gupta
(74) *Attorney, Agent, or Firm* — Eschweiler & Potashnik, LLC

(57) ABSTRACT

The present disclosure, in some embodiments, relates to an integrated chip structure. The integrated chip structure includes a first plurality of interconnects within a first dielectric structure on a first substrate, and a second plurality of interconnects within a second dielectric structure on a second substrate. A bonding structure is arranged between the first dielectric structure and the second substrate. An inter-tier interconnect structure extends between the first plurality of interconnects and the second plurality of interconnects and through the second substrate. The inter-tier interconnect structure includes a first region having substantially vertical sidewalls extending through the second substrate and a second region surrounded by the bonding (Continued)

structure. The second region contacts a bottom of the first region and has tapered sidewalls.

20 Claims, 14 Drawing Sheets

Related U.S. Application Data continuation of application No. 15/365,064, filed on Nov. 30, 2016, now Pat. No. 10,121,812.

(60) Provisional application No. 62/272,128, filed on Dec. 29, 2015.

(51) Int. Cl.
| | | |
|---|---|---|
| *H01L 23/00* | (2006.01) | |
| *H01L 23/528* | (2006.01) | |
| *H01L 25/065* | (2023.01) | |
| *H01L 25/00* | (2006.01) | |
| *H01L 23/532* | (2006.01) | |
| *H01L 21/768* | (2006.01) | |
| *H01L 21/78* | (2006.01) | |

(52) U.S. Cl.
CPC ........ *H01L 23/481* (2013.01); *H01L 23/5283* (2013.01); *H01L 24/00* (2013.01); *H01L 25/0657* (2013.01); *H01L 25/50* (2013.01); *H01L 27/1463* (2013.01); *H01L 27/1469* (2013.01); *H01L 27/14636* (2013.01); *H01L 23/53223* (2013.01); *H01L 23/53238* (2013.01); *H01L 23/53266* (2013.01); *H01L 23/53295* (2013.01); *H01L 2224/80895* (2013.01); *H01L 2224/80896* (2013.01)

(56) References Cited

U.S. PATENT DOCUMENTS

| | | |
|---|---|---|
| 2009/0085135 A1 | 4/2009 | Bang |
| 2009/0269905 A1 | 10/2009 | Chen et al. |
| 2010/0171218 A1* | 7/2010 | Aoi .................. H01L 21/76898 |
| | | 257/E21.597 |
| 2010/0248412 A1 | 9/2010 | Guidash |
| 2011/0068466 A1* | 3/2011 | Chen ................. H01L 21/76898 |
| | | 257/737 |
| 2011/0102657 A1 | 5/2011 | Takahashi et al. |
| 2011/0201197 A1 | 8/2011 | Nilsson et al. |
| 2013/0015588 A1* | 1/2013 | Park ........................ H01L 24/05 |
| | | 257/774 |
| 2013/0285180 A1 | 10/2013 | Wang et al. |
| 2013/0285183 A1 | 10/2013 | Chen et al. |
| 2015/0064832 A1 | 3/2015 | Wan et al. |
| 2015/0115330 A1 | 4/2015 | Park et al. |
| 2015/0262989 A1 | 9/2015 | Kawasaki et al. |
| 2015/0279891 A1 | 10/2015 | Chen et al. |
| 2017/0077169 A1 | 3/2017 | Masuda et al. |

FOREIGN PATENT DOCUMENTS

| | | |
|---|---|---|
| JP | 2013084763 A | 5/2013 |
| JP | 2014103210 A | 6/2014 |

OTHER PUBLICATIONS

Notice of Allowance dated Jun. 22, 2018 for U.S. Appl. No. 15/365,064.
Non-Final Office Action dated Aug. 6, 2020 for U.S. Appl. No. 16/167,810.
Final Office Action dated Nov. 27, 2020 for U.S. Appl. No. 16/167,810.
Notice of Allowance dated Feb. 17, 2021 for U.S. Appl. No. 16/167,810.

\* cited by examiner

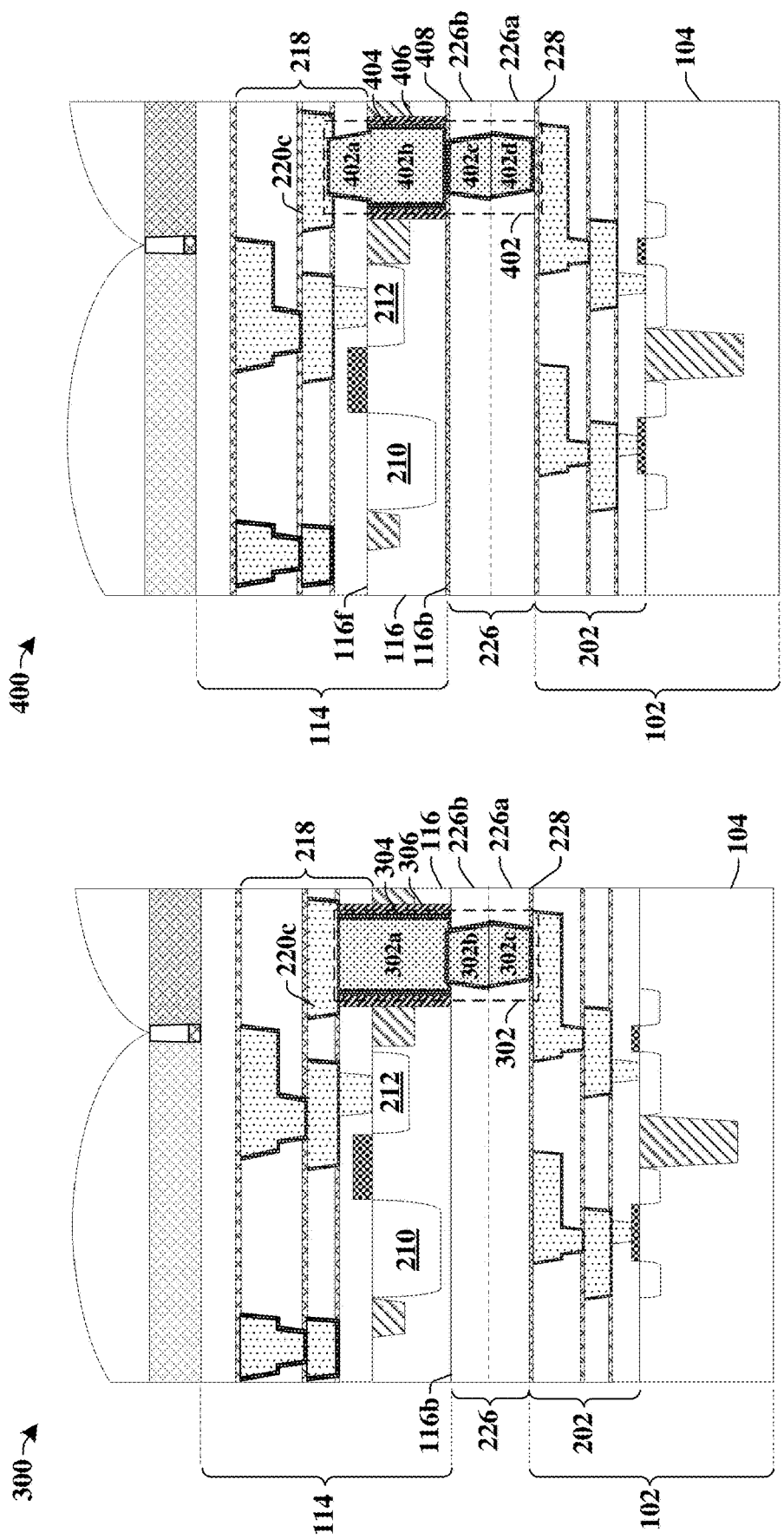

STACKED SUBSTRATE STRUCTURE WITH INTER-TIER INTERCONNECTION

REFERENCE TO RELATED APPLICATIONS

This Application is a Continuation of U.S. application Ser. No. 16/167,810, filed on Oct. 23, 2018, which is a Continuation of U.S. application Ser. No. 15/365,064, filed on Nov. 30, 2016 (now U.S. Pat. No. 10,121,812, issued on Nov. 6, 2018), which claims the benefit of U.S. Provisional Application No. 62/272,128, filed on Dec. 29, 2015. The contents of the above-referenced patent applications are hereby incorporated by reference in their entirety.

BACKGROUND

A multi-dimensional integrated chip is an integrated circuit having multiple substrates or die which are vertically stacked onto and electrically interconnected to one another. By electrically interconnecting the stacked substrates or die, the multi-dimensional integrated chip acts as a single device, which provides improved performance, reduced power consumption, and a smaller footprint over convention integrated chips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a cross-sectional view of some additional embodiments of a FSI-CIS arranged within a 3DIC structure having tiers connected in a front-to-back configuration.

FIG. 4 illustrates a cross-sectional view of some additional embodiments of a FSI-CIS arranged within a 3DIC structure having tiers connected in a front-to-back configuration.

DETAILED DESCRIPTION

Figure 1:
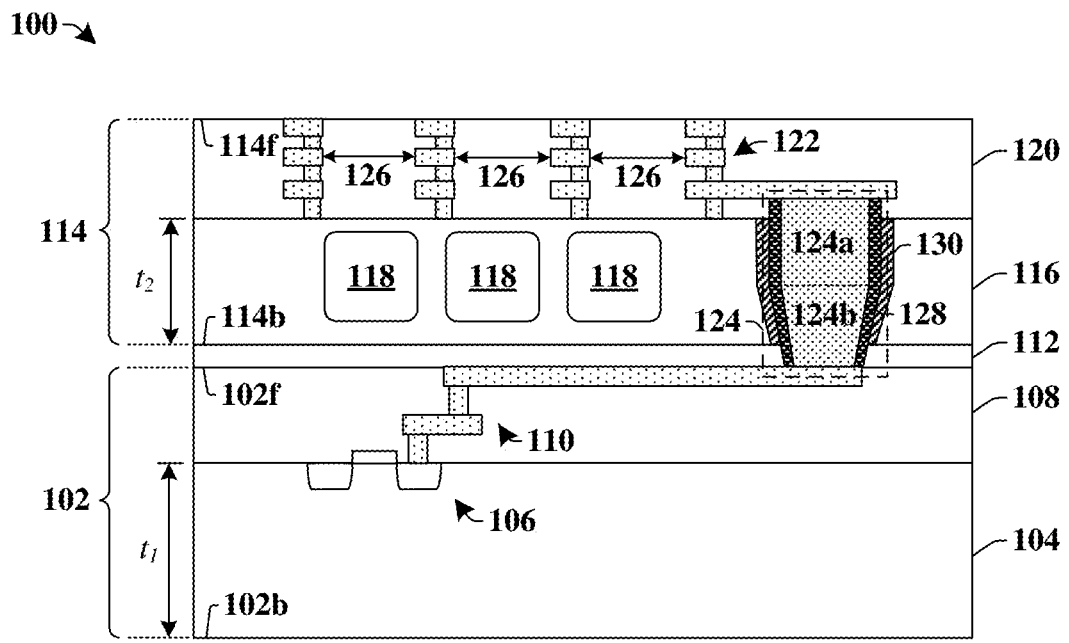
FIG. 1 illustrates a cross-sectional view of some embodiments of a multi-dimensional integrated chip structure having first and second tiers connected in a front-to-back configuration.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits (IC) with image sensors are used in a wide range of modern day electronic devices, such as cell phones and computers, for example. Complementary metal-oxide semiconductor (CMOS) image sensors (CIS) have become popular types of IC image sensors. Compared to charge-coupled devices (CCD), CMOS image sensors have low power consumption, small size, fast data processing, a direct output of data, and low manufacturing cost. Some types of CMOS image sensors include front-side illuminated CMOS image sensors (FSI-CIS) and back-side illuminated CMOS image sensors (BSI-CIS). FSI-CIS have image sensing elements arranged along a front-side of a substrate so that a plurality of metal interconnect layers are arranged within an optical path of an image sensing element. BSI-CIS are arranged along a back-side of a substrate and do not have metal interconnect layers within an optical path of an image sensing element.

CIS are increasingly being integrated into multi-dimensional integrated chip structures having a substrate with image sensing elements stacked onto a substrate with logic devices. The integration of CIS into multi-dimensional integrated chip structures improves performance and decreases power consumption over conventional packaging schemes. Typically, stacked integrated chip structures adopt a front-side to front-side bonding that couples together back-end-of-the-line (BEOL) metallization stacks of logic and image sensor substrates. For BSI-CIS, the image sensing substrate is subsequently thinned to allow light to pass through a back-side of the image sensing substrate. However, such a stacked integrated chip structure is not suitable for FSI-CIS since it does not allow FSI-CIS to receive light.

The present disclosure relates to a method of forming a multi-dimensional integrated chip having tiers connected in a front-to-back configuration, and an associated apparatus. In some embodiments, the method is performed by forming one or more semiconductor devices within a first substrate, and forming one or more image sensing elements within a second substrate. A first dielectric structure over the first substrate is bonded to a back-side of the second substrate by way of a bonding structure. An inter-tier interconnect structure, comprising a plurality of different segments, respectively having sidewalls with different sidewall angles, is formed to extend through the bonding structure and the second substrate. The inter-tier interconnect structure is configured to electrically couple a first metal interconnect layer over the first substrate to a second metal interconnect layer over the second substrate. Bonding the first dielectric structure to a back-side of the second substrate allows for the image sensing elements to be integrated as front-side image sensors within the multi-dimensional integrated chip structure.

FIG. 1 illustrates a cross-sectional view of some embodiments of a multi-dimensional integrated chip structure 100 having a first tier connected to a second tier in a front-to-back configuration.

The multi-dimensional integrated chip structure 100 comprises a first tier 102 and a second tier 114. The first tier 102 has a front-side 102f and a back-side 102b. The second tier 114 also has a front-side 114f and a back-side 114b. The front-side 102f of the first tier 102 is bonded to the back-side 114b of the second tier 114 by way of a bonding structure 112 arranged between the first tier 102 and the second tier 114. In some embodiments, the bonding structure 112 may comprise two dielectric (e.g., oxide) bonding layers abutting along a bonding interface, for example.

The first tier 102 comprises a first substrate 104 arranged along the back-side 102b and a first dielectric structure 108 arranged over the first substrate 104 along the front-side 102f. One or more semiconductor devices 106 are arranged within the first substrate 104. In various embodiments, the one or more semiconductor devices 106 may comprise transistor devices and/or passive devices, for example. A first plurality of metal interconnect layers 110 are arranged within the first dielectric structure 108.

The second tier 114 comprises a second substrate 116 arranged along the back-side 114b and a second dielectric structure 120 arranged over the second substrate 116 along the front-side 114f. In some embodiments, one or more image sensing elements 118, which are configured to generate charge carriers (e.g., electron-hole pair) from incident radiation, are arranged within the second substrate 116. In other embodiments, the second substrate 116 may alternatively and/or additionally comprise logic devices, passive devices, MEMs devices, etc. A second plurality of metal interconnect layers 122 are arranged within the second dielectric structure 120. In some embodiments, the second plurality of metal interconnect layers 122 are arranged to have openings 126 that overlie the one or more image sensing elements 118. The openings 126 allow radiation incident on the front-side 114f to reach the one or more image sensing elements 118.

An inter-tier interconnect structure 124 is configured to electrically couple the first tier 102 and the second tier 114. The inter-tier interconnect structure 124 extends from one of the first plurality of metal interconnect layers 110, through the bonding structure 112 and the second substrate 116, to one of the second plurality of metal interconnect layers 122. In some embodiments, a diffusion barrier layer 128 is arranged along sides of the inter-tier interconnect structure 124. The inter-tier interconnect structure 124 may also be separated from the second substrate 116 by way of an electrically isolating layer 130 (e.g., an oxide).

The inter-tier interconnect structure 124 comprises a plurality of different segments, 124a and 124b, which respectively have sidewalls with different slopes (i.e., different sidewall angles). The plurality of different segments, 124a and 124b, cause the inter-tier interconnect structure 124 to have stepped sides, extending between top and bottom surfaces of the inter-tier interconnect structure 124, which do not extend along a straight line between the top and bottom surfaces. In some embodiments, the slopes of connected segment sidewalls may have different polarities (e.g., a first segment may have a sidewall with a positive slope coupled to a second segment having a sidewall with a negative slope).

In some embodiments, the first substrate 104 may have a different thickness than the second substrate 116. For example, in some embodiments, the first substrate 104 has a first thickness $t_1$ and the second substrate 116 has a second thickness $t_2$ that is less than the first thickness $t_1$. For example, in some embodiments, the first thickness $t_1$ may be in a first range of between approximately 100 um and approximately 1,000 um, while the second thickness $t_2$ may be in a second range of between approximately 1.5 um and approximately 100 um. The smaller second thickness $t_2$ of the second substrate 116 improves performance of the multi-dimensional integrated chip structure 100 by decreasing interconnect distance between the first tier 102 and the second tier 114. It also allows for the inter-tier interconnect structure 124 to be easily formed to couple the first tier 102 to the second tier 114 using multiple different etching processes. The different slopes of the inter-tier interconnect structure 124 are a result of different etching processes that are used to form the inter-tier interconnect structure 124.

Figure 2:
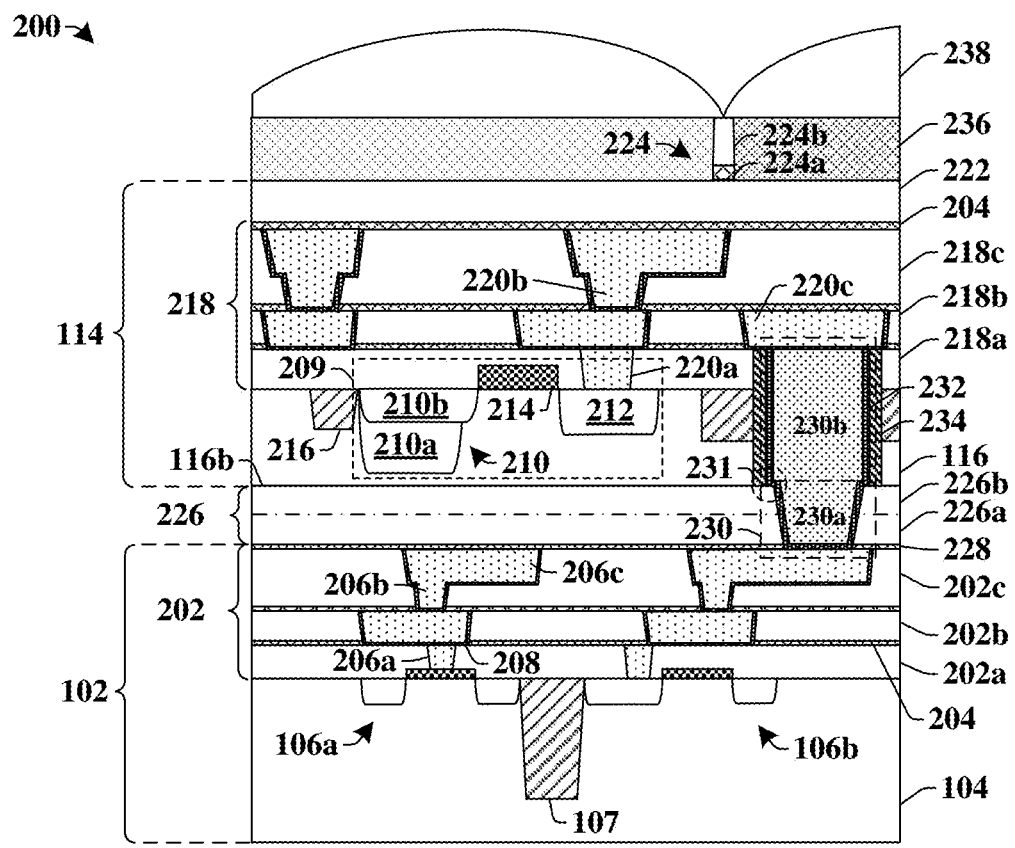
FIG. 2 illustrates a cross-sectional view of some embodiments of a front-side illuminated CMOS image sensor (FSI-CIS) arranged within a three-dimensional integrated chip (3DIC) structure having tiers connected in a front-to-back configuration.

FIG. 2 illustrates a cross-sectional view of some embodiments of a front-side illuminated CMOS image sensor (FSI-CIS) within a three-dimensional integrated chip (3DIC) structure 200 having tiers connected in a front-to-back configuration.

The 3DIC structure 200 comprises a first tier 102 having one or more semiconductor devices 106a-106b arranged within a first substrate 104. In some embodiments, isolation structures 107 may separate adjacent ones of the one or more semiconductor devices 106a-106b. A first dielectric structure 202 is arranged over the first substrate 104. In some embodiments, the first dielectric structure 202 comprises one or more inter-level dielectric (ILD) layers 202a-202c that are vertically separated by etch stop layers 204. A first plurality of metal interconnect layers 206a-206c are arranged within the first dielectric structure 202. In some embodiments, the first plurality of metal interconnect layers 206a-206c may comprise conductive contacts 206a (CO), metal vias 206b (Vx, where x=1:n), and metal interconnect wires 206c (Mx, where x=1:n). The conductive contacts 206a electrically couple the semiconductor devices 106a-106b to the metal interconnect wires 206c, which are separated by the metal vias 206b. In some embodiments, the first plurality of metal interconnect layers 206a-206c may be separated from the first dielectric structure 108 by a diffusion barrier layer 208.

A second tier 114 is arranged over the first tier 102. The second tier 114 comprises one or more pixel regions 209 respectively comprising an image sensing element arranged within a second substrate 116. In some embodiments, an array of pixel regions 209 may be arranged in rows and columns within the second substrate 116. In some embodiments, isolation structures 216 (e.g., STI regions) are arranged on opposing sides of the pixel region 209, so as to provide for electrical isolation between adjacent pixel regions. The image sensing element may comprise a photodiode 210 having a first region 210a with a first doping type (e.g., n-type doping) abutting a second region 210b with a second doping type (e.g., p-type doping) that is different than the first doping type. In some embodiments, the second substrate 116 may have the second doping type. In some embodiments, the first region 210a and the second region 210b may have doping concentrations greater than or equal to approximately 5e15 atoms/cm$^3$.

In some embodiments, the photodiode 210 is operably coupled to a doped region 212 by way of a transistor gate 214 arranged over the second substrate 116. The transistor gate 214 comprises a gate dielectric layer disposed over the second substrate 116 and a gate electrode arranged onto the gate dielectric layer. The transistor gate 214 is laterally arranged between the photodiode 210 and the doped region 212 and is configured to convert light to an electrical signal that is sent to the first tier 102 by controlling the flow of the charge carriers from the photodiode 210 to the doped region 212.

A second dielectric structure 218 is arranged over the second substrate 116. In some embodiments, the second dielectric structure 218 comprises one or more ILD layers 218a-218c that are separated by etch stop layers 204. A second plurality of metal interconnect layers 220a-220c are arranged within the second dielectric structure 218. In some embodiments, the second plurality of metal interconnect layers 220a-220c may comprise conductive contacts 220a, metal vias 220b, and metal interconnect wires 220c. In various embodiments, the first plurality of metal interconnect layers 206a-206c and the second plurality of metal interconnect layers 220a-220c may comprise copper, aluminum, and/or tungsten, and the diffusion barrier layer 208 may comprise tantalum, tantalum-nitride, titanium, and/or titanium-nitride. In various embodiments, the one or more ILD layers, 202a-202c and 218a-218c, may comprise an oxide, an ultra-low k dielectric material, and/or a low-k dielectric material (e.g., SiCO), and the etch stop layers 204 may comprise a nitride (e.g., silicon nitride).

In some embodiments, one or more passivation layers 222 are arranged over the second dielectric structure 218. The one or more passivation layers 222 may comprise oxide and/or nitride layers. A plurality of color filters 236 are arranged over the one or more passivation layers 222. The plurality of color filters 236 are respectively configured to transmit specific wavelengths of radiation. For example, a first color filter (e.g., a red color filter) may transmit radiation having wavelengths within a first range, while a second color filter (e.g., a green color filter) may transmit radiation having wavelengths within a second range different than the first range. In some embodiments, the plurality of color filters 236 may be surrounded by a grid structure 224. In some embodiments, the grid structure 224 may comprise a stacked structure having a dielectric material 224a (e.g., silicon nitride) and an overlying metal layer 224b. The grid structure 224 forms a framework that defines a plurality of openings located over underlying pixel regions 209.

A plurality of micro-lenses 238 are arranged over the plurality of color filters 236. The plurality of micro-lenses 238 are respectively aligned with the color filters 236. In some embodiments, the plurality of micro-lenses 238 have a substantially flat bottom surface abutting the color filters 236, and a curved upper surface. The curved upper surface is configured to focus the incident radiation onto a center of an underlying photodiode 210 to increase efficiency of the photodiode 210. In some embodiments, a bond pad (not shown) may also be arranged over the one or more passivation layers 222 at a location laterally offset from the plurality of micro-lenses 238. The bond pad is configured to extend through the one or more passivation layers 222 to contact one of the second plurality of metal interconnect layers 220a-220c.

The first dielectric structure 202 is bonded to a back-side 116b of the second substrate 116 by way of a bonding structure 226 comprising a first dielectric bonding layer 226a and second dielectric bonding layer 226b. In some embodiments, the first dielectric bonding layer 226a and the second dielectric bonding layer 226b may comprise oxide layers. In some embodiments, a bonding etch stop layer (ESL) 228 is arranged between the bonding structure 226 and the first dielectric structure 202. In some embodiments, the bonding etch stop layer ESL 228 may comprise a nitride (e.g., silicon nitride).

An inter-tier interconnect structure 230 extends from one of the first plurality of metal interconnect layers 206a-206c to one of the second plurality of metal interconnect layers 220a-220c. In various embodiments, the inter-tier interconnect structure 230 may extend from any one of the first plurality of metal interconnect layers 206a-206c (e.g., C0, Vx, or Mx) to any one of the second plurality of metal interconnect layers 220a-220c. In some embodiments, the inter-tier interconnect structure 230 may extend through an isolation structure 216 (e.g., an STI region) within the second substrate 116. In such embodiments, the isolation structure 216 provides for improved isolation between the pixel region 209 and the inter-tier interconnect structure 230. In various embodiments, the inter-tier interconnect structure 230 may comprise a conductive material, such as copper, tungsten, and/or aluminum, for example.

The inter-tier interconnect structure 230 is configured to electrically couple the first tier 102 and the second tier 114. In some embodiments, by connecting the first tier 102 to the second tier 114 using the inter-tier interconnect structure 230, signal processing of signals generated in the pixel regions 209 may be exclusively performed by the semiconductor devices 106a-106b within the first tier 102.

The inter-tier interconnect structure 230 has a first segment 230a and a second segment 230b. The first segment 230a is arranged within the bonding structure 226 and has tapered sidewalls that give the first segment 230a a width that increases as a distance from the first substrate 104 increases. In some embodiments, the first segment 230a may extend from one of the first plurality of metal interconnect layers 206a-206c to an upper surface of the bonding structure 226. The second segment 230b has substantially vertical sidewalls that give the second segment 230b a substantially constant width. In some embodiments, the second segment 230b may extend from the back-side 116b of the second substrate 116 to one of the second plurality of metal interconnect layers 220a-220c.

A diffusion barrier layer 232 extends along sidewalls of the first segment 230a and the second segment 230b. In various embodiments, the diffusion barrier layer 232 may comprise titanium (Ti), titanium nitride (TiN), tantalum (Ta), and/or tantalum nitride (TaN). The diffusion barrier layer 232 has a lateral segment 231 extending along a lower surface of the second segment 230b. An isolation layer 234 extends along the diffusion barrier layer 232 from the back-side 116b of the second substrate 116 to one of the second plurality of metal interconnect layers 220a-220c. In some embodiments, the isolation layer 234 comprises an oxide or a nitride, for example.

FIG. 3 illustrates a cross-sectional view of some alternative embodiments of a FSI-CIS within a 3DIC structure 300 having tiers connected in a front-to-back configuration.

The 3DIC structure 300 comprises an inter-tier interconnect structure 302 having a first segment 302a, a second segment 302b, and a third segment 302c, which respectively comprise a conductive material. The first segment 302a has substantially vertical sidewalls that give the first segment 302a a substantially constant width as a distance from the first substrate 104 increases. In some embodiments, the first segment 302a may extend from a back-side 116b of the second substrate 116 to one of the second plurality of metal interconnect layers 220a-220c. The second segment 302b is arranged within a second dielectric bonding layer 226b. The second segment 302b extends between upper and lower surfaces of the second dielectric bonding layer 226b. In some embodiments, the second segment 302b may extend into a recess within the first segment 302a. The second segment 302b has tapered sidewalls that give the second segment 302b a width that decreases as a distance from the first substrate 104 increases. In some embodiments, the first segment 302a may have a greater width than the second segment 302b. The third segment 302c is arranged within a first dielectric bonding layer 226a of the bonding structure 226. In some embodiments, the third segment 302c extends between an upper surface of the first dielectric bonding layer 226a and one of the first plurality of metal interconnect layers 206a-206c. The third segment 302c has tapered sidewalls that give the first third 302c a width that increases as a distance from the first substrate 104 increases.

A diffusion barrier layer 304 extends along sidewalls and a lower surface of the third segment 302c, along sidewalls and an upper surface of the second segment 302b, and along sidewalls and a lower surface of the first segment 302a. The diffusion barrier layer 304 separates the first segment 302a from the second segment 302b, while the second segment 302b directly contacts the third segment 302c. An isolation layer 306 extends along the diffusion barrier layer 304 from the back-side 116b of the second substrate 116 to one of the second plurality of metal interconnect layers 220a-220c.

FIG. 4 illustrates a cross-sectional view of some alternative embodiments of a FSI-CIS within a 3DIC structure 400 having tiers connected in a front-to-back configuration.

The 3DIC structure 400 comprises a first tier 102 connected to a second tier 114 by way of a bonding structure 226. The bonding structure 226 is separated from the first tier 102 by way of a first bonding ESL 228 and is further separated from the second tier 114 by way of a second bonding ESL 408.

An inter-tier interconnect structure 402 couples the first tier 102 to the second tier 114. The inter-tier interconnect structure 402 comprises a first segment 402a, a second segment 402b, a third segment 402c, and a fourth segment 402d, which respectively comprise a conductive material. The first segment 402a is arranged within a second dielectric structure 218 over a second substrate 116. In some embodiments, the first segment 402a may extend from a front-side 116f of the second substrate 116 to one of a second plurality of metal interconnect layers 220a-220c. The first segment 402a has tapered sidewalls that give the first segment 402a a width that decreases as a distance from the second substrate 116 increases. In some embodiments, the second segment 402b may extend between a back-side 116b and the front-side 116f of the second substrate 116. The second segment 402b has substantially vertical sidewalls that give the second segment 402b a substantially constant width as a distance from the first substrate 104 increases. The third segment 402c is arranged within a second dielectric bonding layer 226b. In some embodiments, the third segment 402c may extend between upper and lower surfaces of the second dielectric bonding layer 226b. The third segment 402c has tapered sidewalls that give the third segment 402c a width that decreases as a distance from the first substrate 104 increases. The fourth segment 402d is arranged within a first dielectric bonding layer 226a. In some embodiments, the fourth segment 402d extends between an upper surface of the first dielectric bonding layer 226a and one of the first plurality of metal interconnect layers 206a-206c. The fourth segment 402d has tapered sidewalls that give the fourth segment 402d a width that increases as a distance from the first substrate 104 increases.

A diffusion barrier layer 404 extends along sidewalls and a lower surface of the fourth segment 402d, along sidewalls and an upper surface of the third segment 402c, along sidewalls and a lower surface of the second segment 402b, and along sidewalls and an upper surface of the first segment 402a. The diffusion barrier layer 404 separates the second segment 402b from the third segment 402c, while the first and second segments, 402a and 402b, and the third and fourth segments, 402c and 402d, directly contact one another. An isolation layer 406 extends along the diffusion barrier layer 404 from the back-side 116b to the front-side 116f of the second substrate 116.

FIGS. 5-14 illustrate cross-sectional views 500-1400 corresponding to some embodiments of methods of forming a multi-dimensional integrated chip structure having tiers connected in a front-to-back configuration. It will be appreciated that elements in FIGS. 5-14 that have been described in previous embodiments have been designated with the same reference numbers for ease of understanding.

Figure 5:
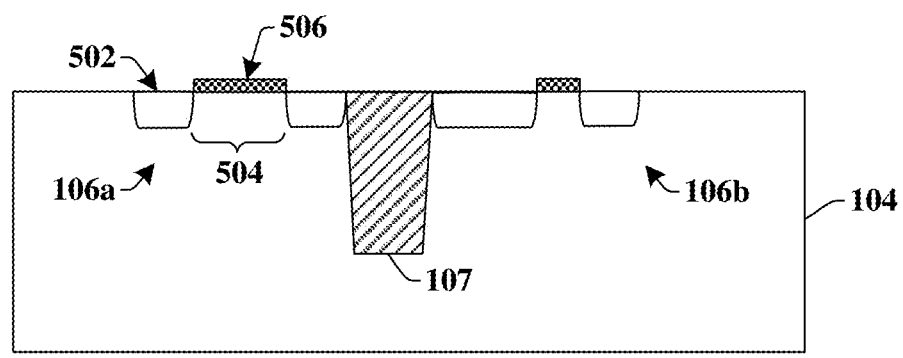
FIGS. 5-14 illustrate cross-sectional views corresponding to some embodiments of methods of forming a multi-dimensional integrated chip structure having tiers connected in a front-to-back configuration.

As shown in cross-sectional view 500 of FIG. 5, one or more semiconductor devices 106a-106b are formed within a first substrate 104. The first substrate 104 may be any type of semiconductor body (e.g., silicon, SiGe, SOI) such as a semiconductor wafer and/or one or more die on a wafer, as well as any other type of semiconductor and/or epitaxial layers associated therewith. In some embodiments, the one or more semiconductor devices 106a-106b may comprise transistor devices having source/drain regions 502 separated by a channel region 504. In such embodiments, a gate structure 506 is formed over the channel region 504. In some embodiments, isolation structures 107 (e.g., STI regions) are formed between adjacent semiconductor devices.

Figure 6:
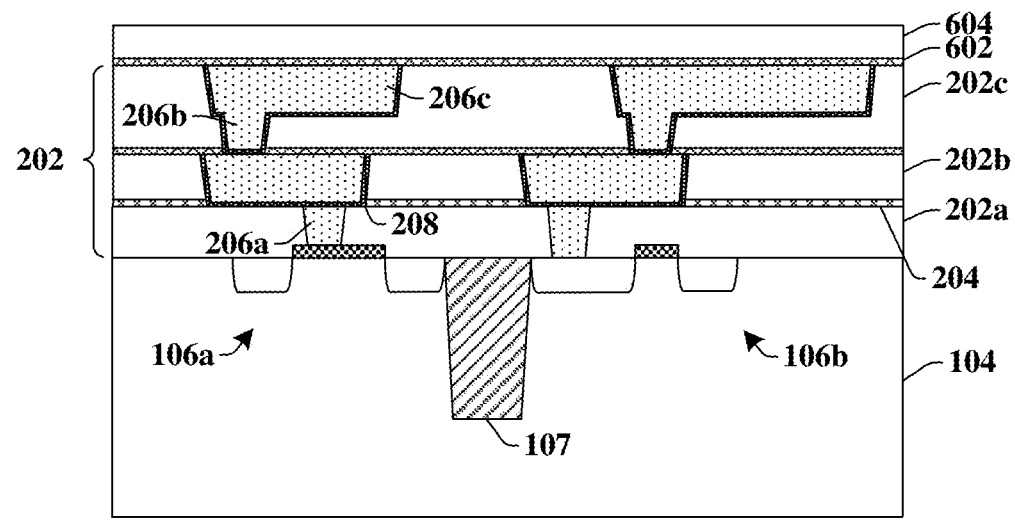

As shown in cross-sectional view 600 of FIG. 6, a first plurality of metal interconnect layers 206a-206c are formed within a first dielectric structure 202 formed over the first substrate 104. In some embodiments, the first plurality of metal interconnect layers 206a-206c may be formed by a damascene process and/or a dual damascene process. In such embodiments, a plurality of ILD layers 202a-202c are formed over the first substrate 104. The ILD layers 202a-202c are separately etched to form via holes and/or metal trenches. The via holes and/or metal trenches are then filled with a conductive material to form one or more of the first plurality of metal interconnect layers 206a-206c. In some embodiments, the ILD layers 202a-202c may be deposited by a physical vapor deposition technique (e.g., PVD, CVD, PE-CVD, ALD, etc.). The first plurality of metal interconnect layers 206a-206c may be formed using a deposition process and/or a plating process (e.g., electroplating, electroless plating, etc.).

A first bonding etch stop layer (ESL) 602 is formed onto the first dielectric structure 202. In some embodiments, the first bonding ESL 602 may comprise a nitride layer. A first dielectric bonding layer 604 is formed onto the first bonding ESL 602. In some embodiments, the first bonding ESL 602 and the first dielectric bonding layer 604 may be formed by deposition processes (e.g., CVD, PVD, PE-CVD, ALD, etc.).

Figure 7:
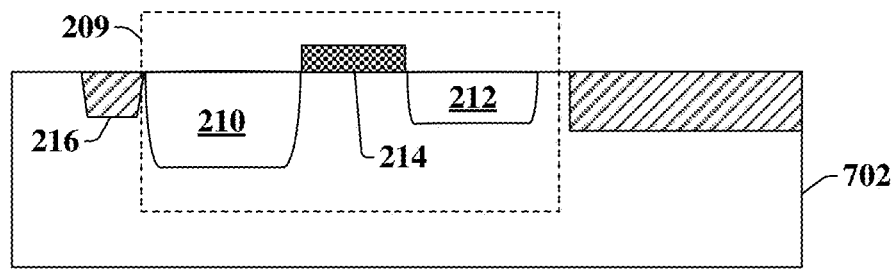

As shown in cross-sectional view 700 of FIG. 7, a second substrate 702 is provided. In some embodiments, a plurality of image sensing elements are formed within a pixel region 209 of the second substrate 702. In other embodiments, one or more of a transistor device, a passive device, and/or a MEMs device may alternatively or additionally be formed within the second substrate 702.

In some embodiments, the plurality of image sensing elements may respectively comprise a photodiode 210 having abutting regions with different doping types. In such embodiments, the photodiode 210 may be formed by selectively implanting the second substrate 702 with a first implantation process performed according to a first masking layer and a second subsequent implantation process performed according to a second masking layer. In some embodiments, a doped region 212 may also be formed within the pixel region 209 by selectively implanting the second substrate 702 with one or more dopant species.

A transistor gate 214 may be subsequently formed between the photodiode 210 and the doped region 212. The transistor gate 214 may be formed by depositing a gate dielectric film and a gate electrode film over the second substrate 702. The gate dielectric film and the gate electrode film are subsequently patterned to form a gate dielectric layer and a gate electrode. In some embodiments, one or more isolation structures 216 (e.g., shallow trench isolation regions) may be formed within the second substrate 702 on opposing sides of the pixel region 209. In some embodiments, the one or more isolation structures 216 may be formed prior to formation of the plurality of image sensing elements.

Figure 8:
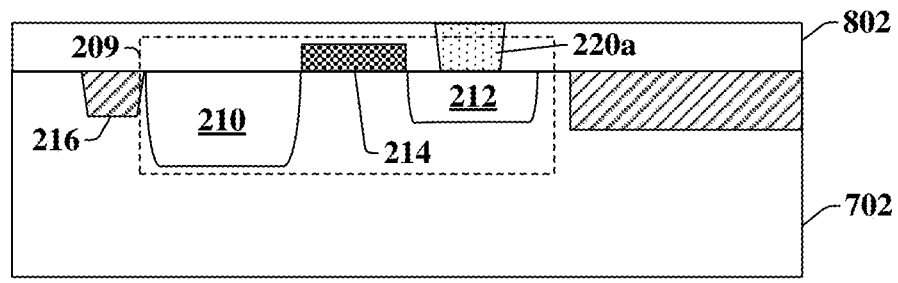

As shown in cross-sectional view 800 of FIG. 8, one or more metal interconnect layers 220a are formed within one or more dielectric layers 802 overlying the second substrate 702. In some embodiments, one or more metal interconnect layers 220a may be formed using a damascene and/or a dual damascene process.

Figure 9:
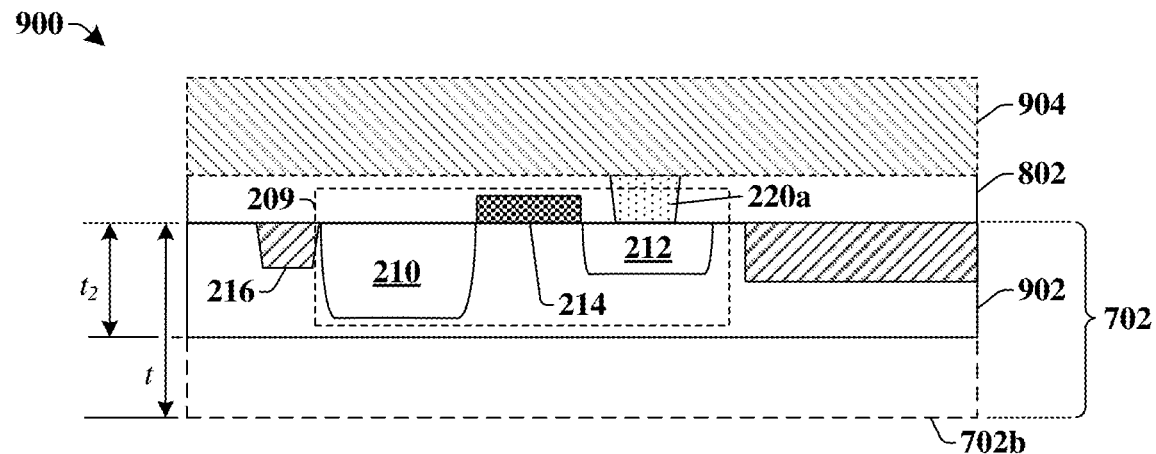

As shown in cross-sectional view 900 of FIG. 9, after forming one or more metal interconnect layers 220a, the second substrate 702 is thinned. Thinning the second substrate 702 reduces a thickness of the second substrate 702 from a thickness t to form a second substrate 902 having a thickness $t_2$. Reducing the thickness allows for the second substrate 902 to be easily connected to the first substrate 104 using an inter-tier interconnect structure. In some embodiments, the second substrate 702 may be thinned by etching a back-side 702b of the second substrate 702. In other embodiments, the second substrate 702 may be thinned by mechanically grinding the back-side 702b of the second substrate 702.

In some embodiments, the one or more dielectric layers 802 are bonded to a handle substrate 904 prior to thinning. In some embodiments, the bonding process may use an intermediate bonding oxide layer (not shown) arranged between the one or more dielectric layers 802 and the handle substrate 904. In some embodiments, the bonding process may comprise a fusion bonding process. In some embodiments, the handle substrate 904 may comprise a silicon wafer. After bonding the one or more dielectric layers 802 to the handle substrate 904, the second substrate 702 may be thinned.

FIGS. 10A-10E illustrate cross-sectional views of some embodiments showing the formation of an inter-tier interconnect structure configured to connect first and second tiers in a front-to-back configuration.

Figure 10A:
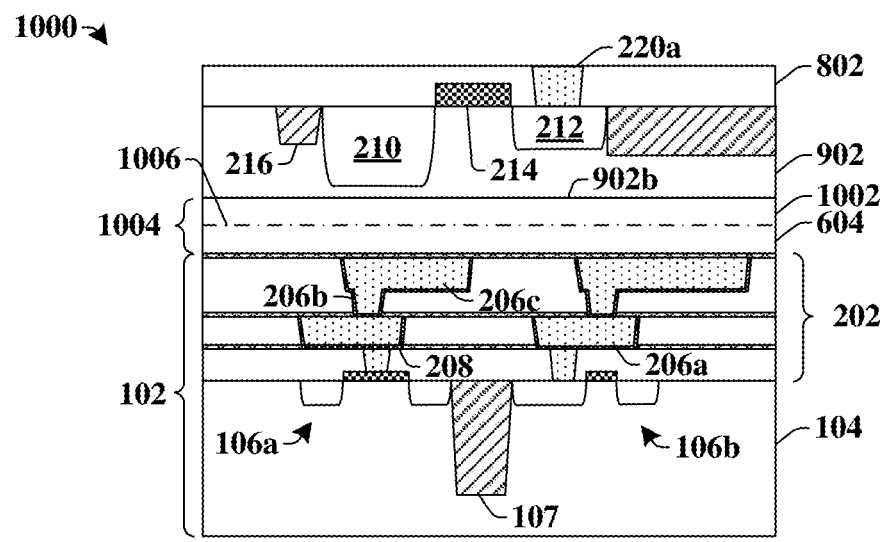

As shown in cross-sectional view 1000 of FIG. 10A, a second dielectric bonding layer 1002 is formed on a backside 902b of the second substrate 902. The first dielectric bonding layer 604 is subsequently bonded to the second dielectric bonding layer 1002 along a dielectric-dielectric (e.g., oxide-oxide) bonding interface 1006. The bonding process forms a bonding structure 1004 that connects the first dielectric structure 202 to the second substrate 902. In some embodiments, the bonding process may comprise a fusion bonding process, for example. In some embodiments, the bonding process may comprise a 'wafer level bonding process' that bonds the first substrate 104, which comprises a wafer (e.g., a first 300 mm wafer) to the second substrate 116, which also comprises a wafer (e.g., a second 300 mm wafer).

Figure 10B:
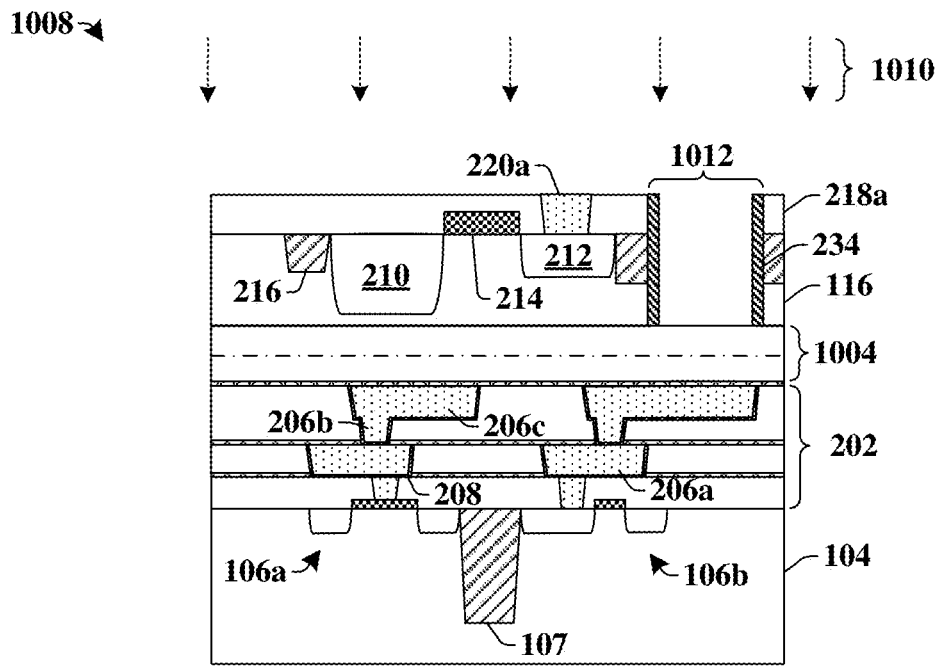

As shown in cross-sectional view 1008 of FIG. 10B, a first etching process is performed in a direction of a front-side of the second substrate 116 using a first etchant 1010 to form a first opening 1012. The first opening 1012 extends through ILD layer 218a and the second substrate 116 to contact the bonding structure 1004. In some embodiments, the first etching process may comprise a first anisotropic etching process that results in substantially vertical sidewalls (e.g., a dry anisotropic etching process). An isolation layer 234 is formed on sidewalls of the first opening 1012. In some embodiments, the isolation layer 234 may comprise an oxide layer. In various embodiments, the isolation layer 234 may be formed by a deposition process or by a thermal process.

Figure 10C:
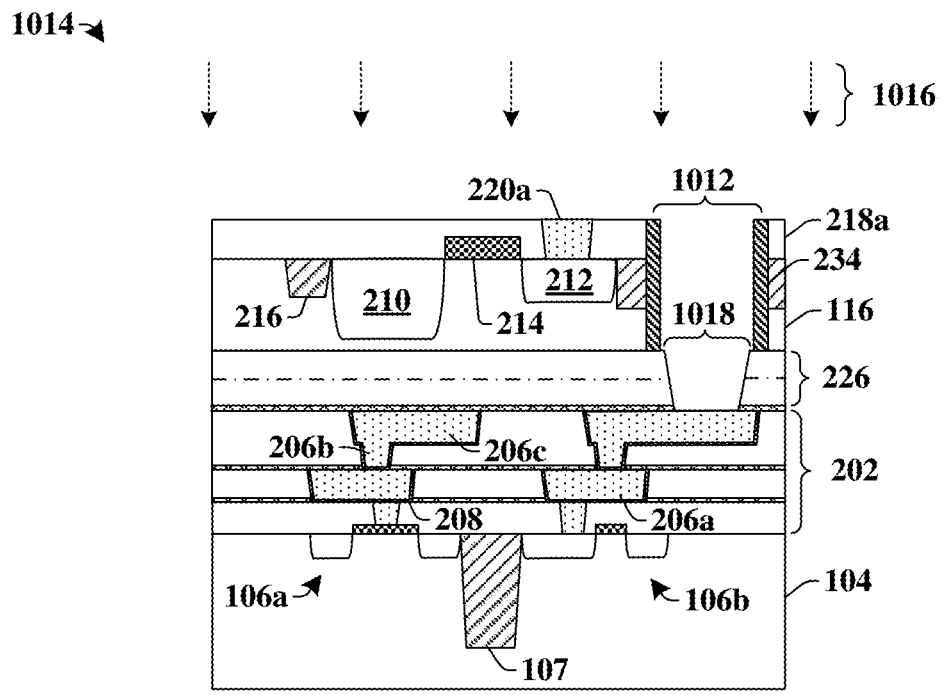

As shown in cross-sectional view 1014 of FIG. 10C, a second etching process is performed using a second etchant 1016 to from a second opening 1018. The second opening 1018 extends through the bonding structure 226 to contact one of the first plurality of metal interconnect layers 206a-206c. In some embodiments, the second etching process may comprise a second anisotropic etching process that results in tapered sidewalls (e.g., a wet anisotropic etching process).

Figure 10D:
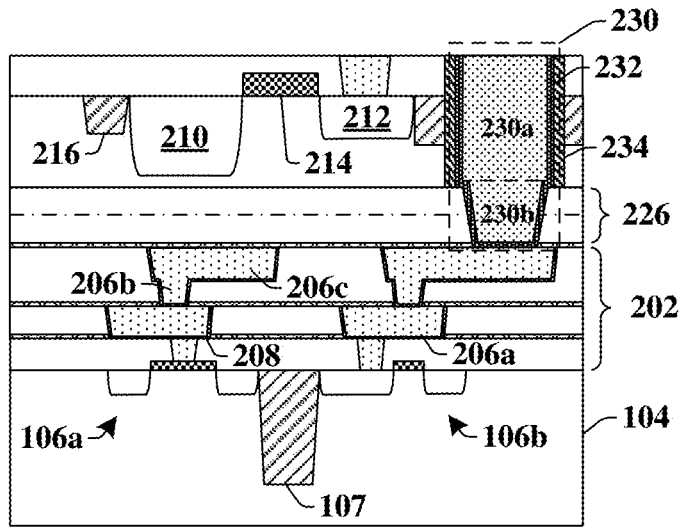

As shown in cross-sectional view 1020 of FIG. 10D, a diffusion barrier layer 232 is formed along sidewalls and bottom surfaces of the first opening (e.g., 1012 of FIG. 10C) and the second opening (e.g., 1018 of FIG. 10C). The first opening (e.g., 1012 of FIG. 10C) and the second opening (e.g., 1018 of FIG. 10C) are subsequently filled with a conductive material to form a first segment 230a and a second segment 230b of an inter-tier interconnect structure 230. A planarization process (e.g., a CMP process) may be subsequently performed to remove excess conductive material from outside of the first opening (e.g., 1012 of FIG. 10C) and the second opening (e.g., 1018 of FIG. 10C).

Figure 10E:
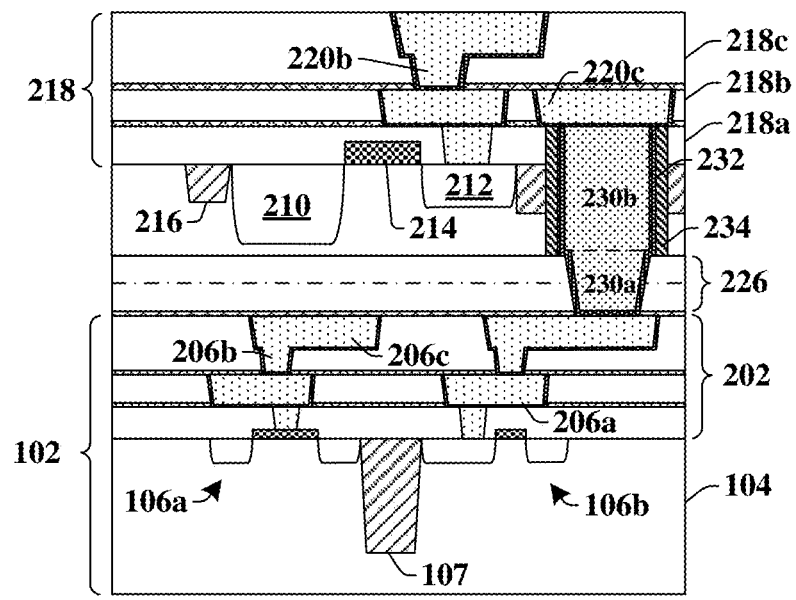

As shown in cross-sectional view 1022 of FIG. 10E, one or more metal interconnect layers, 220b and 220c, are formed within a dielectric structure 218 having one or more ILD layers, 218b and 218c, overlying ILD layer 218a. One of the one or more metal interconnect layers, 220b and 220c, is formed onto the first segment 230a. In some embodiments, one or more metal interconnect layers, 220b and 220c, may be formed using a damascene and/or dual damascene process.

FIGS. 11A-11E illustrates cross-sectional views of some alternative embodiments showing the formation of an inter-tier interconnect structure configured to connect first and second tiers in a front-to-back configuration.

Figure 11A:
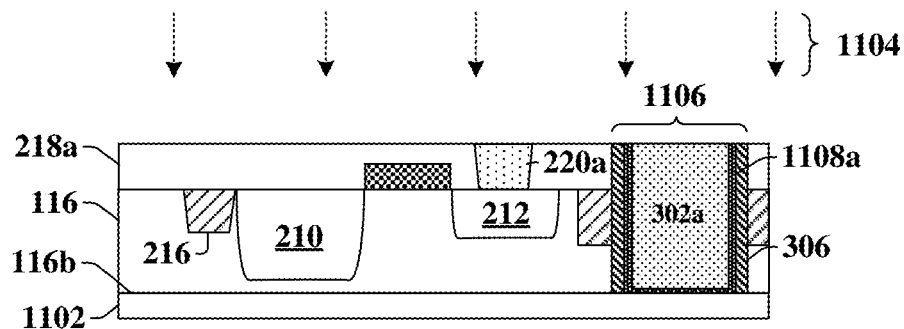

As shown in cross-sectional view 1100 of FIG. 11A, a second dielectric bonding layer 1102 is formed on a backside 116b of the second substrate 116. A first etching process is subsequently performed in a direction of a front-side of the second substrate 116 using a first etchant 1104 to from a first opening 1106. The first opening 1106 extends through ILD layer 218a and the second substrate 116 to contact the second dielectric bonding layer 1102. In some embodiments, the first etching process may comprise a first anisotropic etching process that results in substantially vertical sidewalls (e.g., a dry anisotropic etching process).

An isolation layer 306 is subsequently formed on sidewalls of the first opening 1106. In some embodiments, the isolation layer 306 may comprise an oxide layer formed by a deposition or thermal process. A diffusion barrier layer 1108a is formed along sidewalls of the isolation layer 306 and a bottom surface of the first opening 1106. The first opening 1106 is subsequently filled with a first conductive material to form a first segment 302a of an inter-tier interconnect structure. A planarization process may be subsequently performed to remove excess conductive material from outside of the first opening 1106.

Figure 11B:
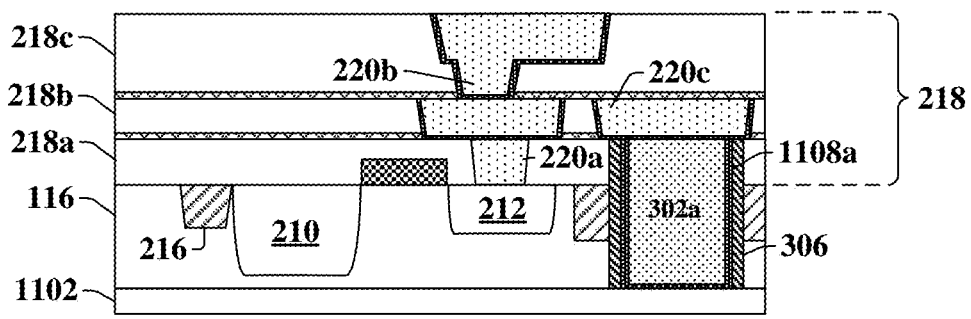

As shown in cross-sectional view 1110 of FIG. 11B, one or more metal interconnect layers, 220b and 220c, are formed within a dielectric structure having one or more ILD layers, 218b and 218c, overlying the second substrate 116. One of the one or more metal interconnect layers, 220b and 220c, is formed onto the first segment 302a. In some embodiments, one or more metal interconnect layers, 220b and 220c, may be formed using a damascene and/or dual damascene process. In some alternative embodiments, the one or more metal interconnect layers, 220b and 220c, may be formed after FIG. 11E.

Figure 11C:
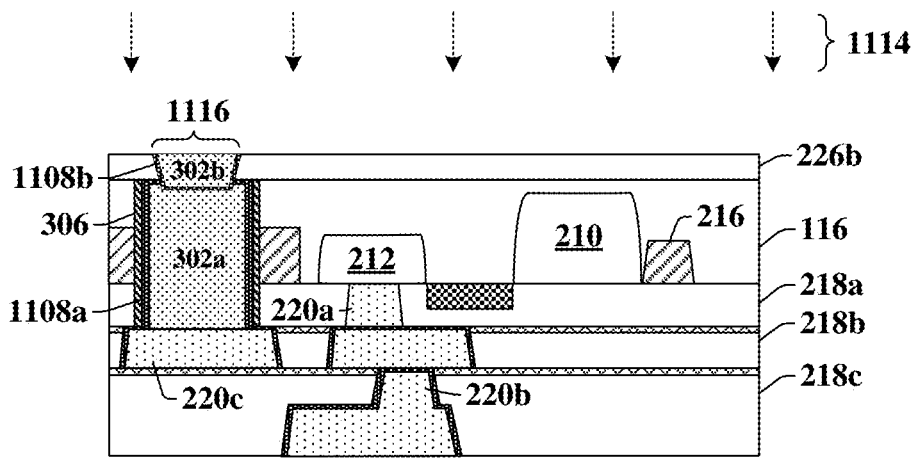

As shown in cross-sectional view 1112 of FIG. 11C, a second etching process is performed in a direction of a back-side of the second substrate 116 using a second etchant 1114 to form a second opening 1116 extending through the second dielectric bonding layer 226b. In some embodiments, the second etching process may comprise an anisotropic etching process that results in the second opening 1116 having tapered sidewalls (e.g., a wet anisotropic etching process). A diffusion barrier layer 1108b is formed along sidewalls and bottom surface of the second opening 1116. The second opening 1116 is subsequently filled with a second conductive material to form a second segment 302b of the inter-tier interconnect structure. A planarization process may be subsequently performed to remove excess conductive material from outside of the second opening 1116.

Figure 11D:
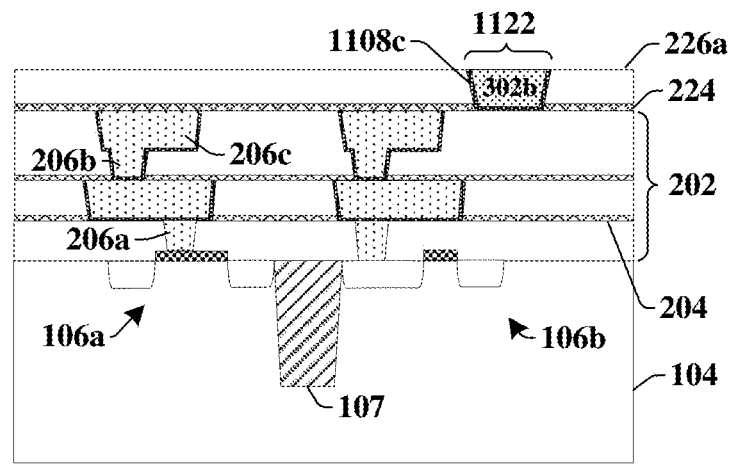

As shown in cross-sectional view 1118 of FIG. 11D, a third etching process is performed in a direction of a front-side of the first substrate 104 using a third etchant 1120 to form a third opening 1122 extending through the first dielectric bonding layer 226a and the first bonding ESL 228. In some embodiments, the third etching process may comprise an anisotropic etching process that results in the third opening 1122 having tapered sidewalls (e.g., a wet anisotropic etching process). A diffusion barrier layer 1108c is formed along sidewalls and bottom surface of the third opening 1122. The third opening 1122 is subsequently filled with a third conductive material to form a third segment 302c of the inter-tier interconnect structure. In various embodiments, the first, second and third conductive materials may comprise a same material or different materials. A planarization process may be subsequently performed to remove excess conductive material from outside of the third opening 1122.

Figure 11E:
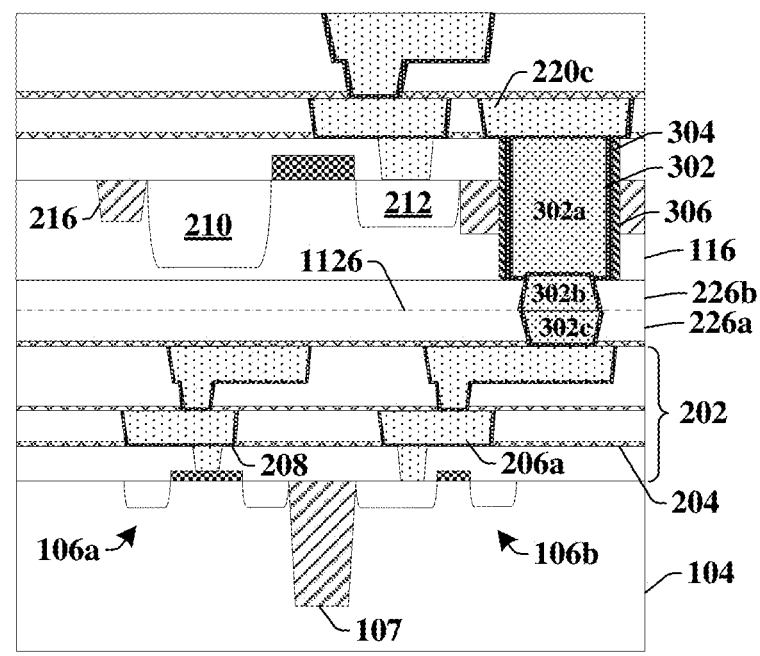

As shown in cross-sectional view 1124 of FIG. 11E, the first dielectric bonding layer 226a and the third segment 302c of the inter-tier interconnect structure are bonded to the second dielectric bonding layer 226b and the second segment 302b of the inter-tier interconnect structure along a hybrid bonding interface 1126 comprising a dielectric material and a conductive material. In some embodiments, the bonding process is a 'wafer level bonding process' that bonds the first substrate 104, which comprises a wafer (e.g., a first 300 mm wafer) to the second substrate 116, which comprises a wafer (e.g., a second 300 mm wafer).

FIGS. 12A-12E illustrate cross-sectional views of some alternative embodiments showing the formation of an inter-tier interconnect structure configured to connect first and second tiers in a front-to-back configuration.

Figure 12A:
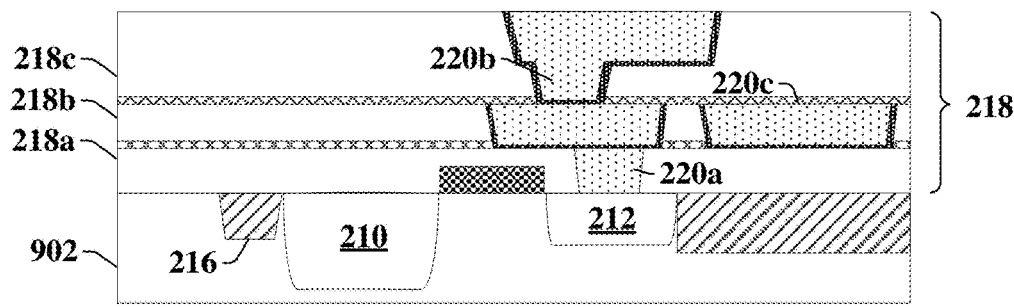

As shown in cross-sectional view 1200 of FIG. 12A, one or more metal interconnect layers, 220b and 220c, are formed within a dielectric structure having one or more ILD layers, 218b and 218c, overlying the second substrate 902. In some embodiments, one or more metal interconnect layers, 220b and 220c, may be formed using a damascene and/or dual damascene process.

Figure 12B:
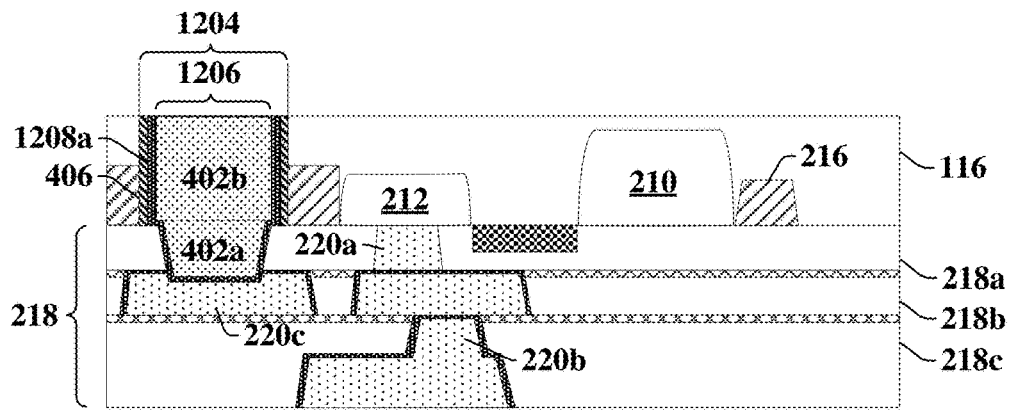

As shown in cross-sectional view 1202 of FIG. 12B, a first etching process is performed in a direction of the back-side of the second substrate 116 to form a first opening 1204 extending through the second substrate 116 and having substantially vertical sidewalls. An isolation layer 406 is formed along sidewalls of the first opening 1204. A second etching process is subsequently performed in a direction of the back-side of the second substrate 116 to form a second opening 1206 extending through a first ILD layer 218a to one of the metal interconnect layers 220a-220c. The second opening 1206 has a width that decreases as a distance from the second substrate 116 increases. In some embodiments, the second opening 1206 may extend into a recess within one of second plurality of metal interconnect layers 220a-220c. A diffusion barrier layer 1208a is formed along sidewalls of the isolation layer 406 and sidewalls and a lower surface of the second opening 1206. The first opening 1204 and the second opening 1206 are subsequently filled with a first conductive material to form a first segment 402a and a second segment 402b of an inter-tier interconnect structure.

Figure 12C:
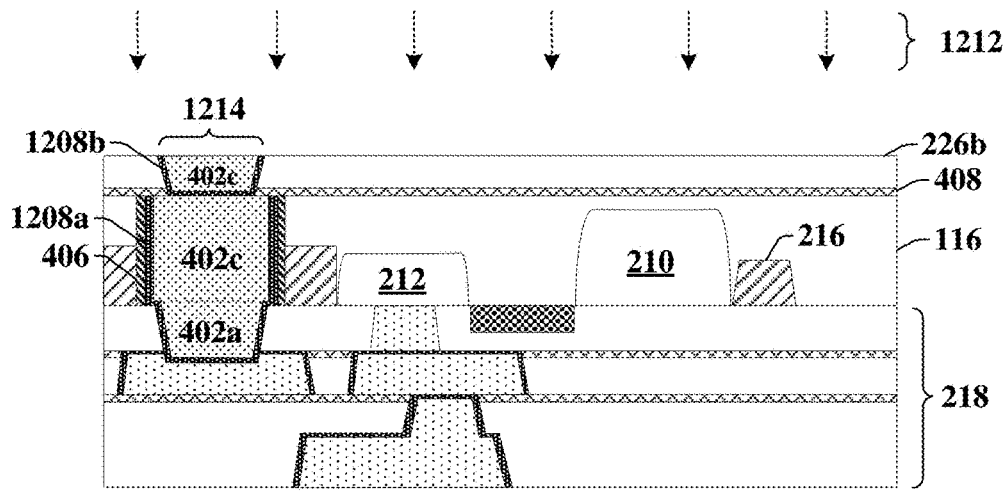

As shown in cross-sectional view 1210 of FIG. 12C, a second bonding ESL 408 and a second dielectric bonding layer 226b are formed on a back-side of the second substrate 116. A third etching process is performed using a third etchant 1212 to from a third opening 1214 extending through the second bonding ESL 408 and the second dielectric bonding layer 226b. In some embodiments, the third etching process may comprise an anisotropic etching process that results in the third opening 1214 having tapered sidewalls (e.g., a wet anisotropic etching process). The third opening 1214 is subsequently filled with a diffusion barrier layer 1208b and a second conductive material to form a third segment 402c of the inter-tier interconnect structure.

Figure 12D:
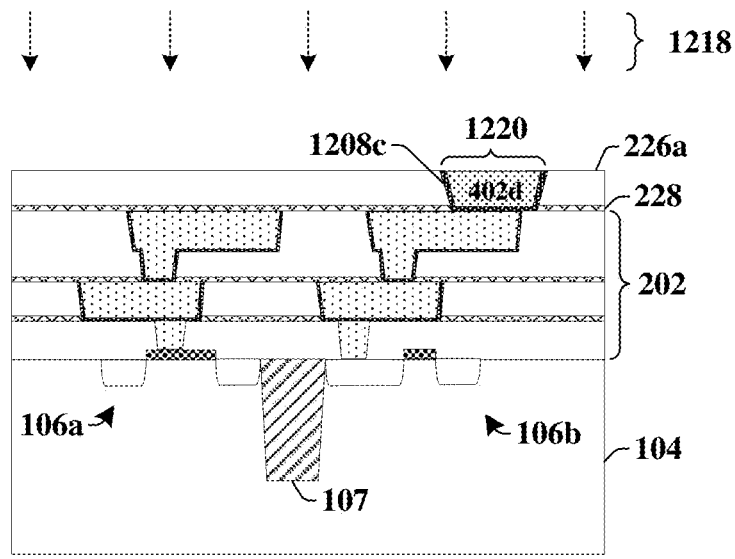

As shown in cross-sectional view 1216 of FIG. 12D, a fourth etching process is performed using a fourth etchant 1218 to form a fourth opening 1220 extending through the first dielectric bonding layer 226a and the first bonding ESL 228. In some embodiments, the fourth etching process may comprise an anisotropic etching process that results in the fourth opening 1220 having tapered sidewalls (e.g., a wet anisotropic etching process). A diffusion barrier layer 1208c is formed along sidewalls and bottom surface of the fourth opening 1220. The fourth opening 1220 is subsequently filled with a third conductive material to form a fourth segment 402d of the inter-tier interconnect structure. A planarization process may be subsequently performed to remove excess conductive material from outside of the fourth opening 1220.

Figure 12E:
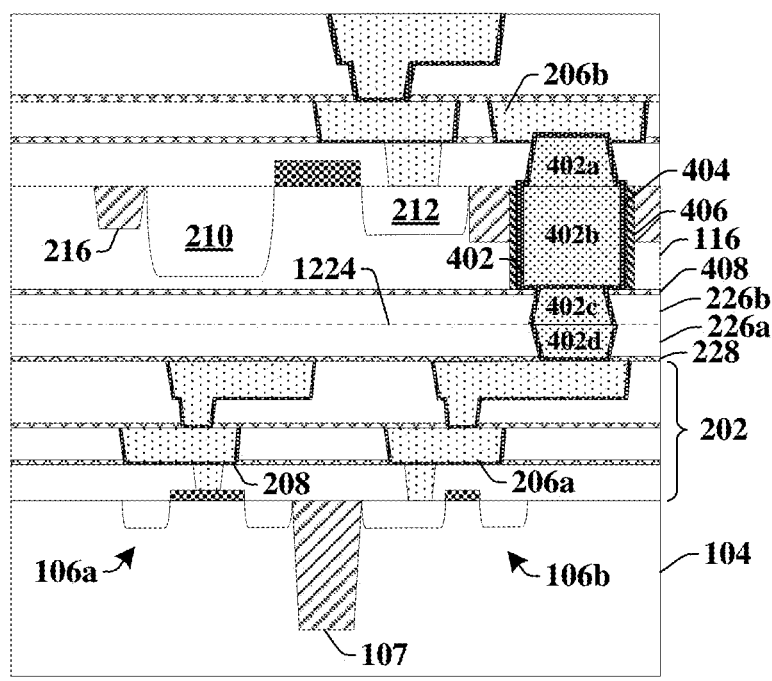

As shown in cross-sectional view 1222 of FIG. 12E, the first dielectric bonding layer 226a and the fourth segment 402d of the inter-tier interconnect structure are bonded to the second dielectric bonding layer 226b and the third segment 402c of the inter-tier interconnect structure along a hybrid bonding interface region 1224 comprising a dielectric material and a conductive material. In some embodiments, the bonding process is a 'wafer level bonding process' that bonds the first substrate 104, which comprises a wafer (e.g., a first 300 mm wafer) to a the second substrate 116, which comprises a wafer (e.g., a first 300 mm wafer).

Figure 13:
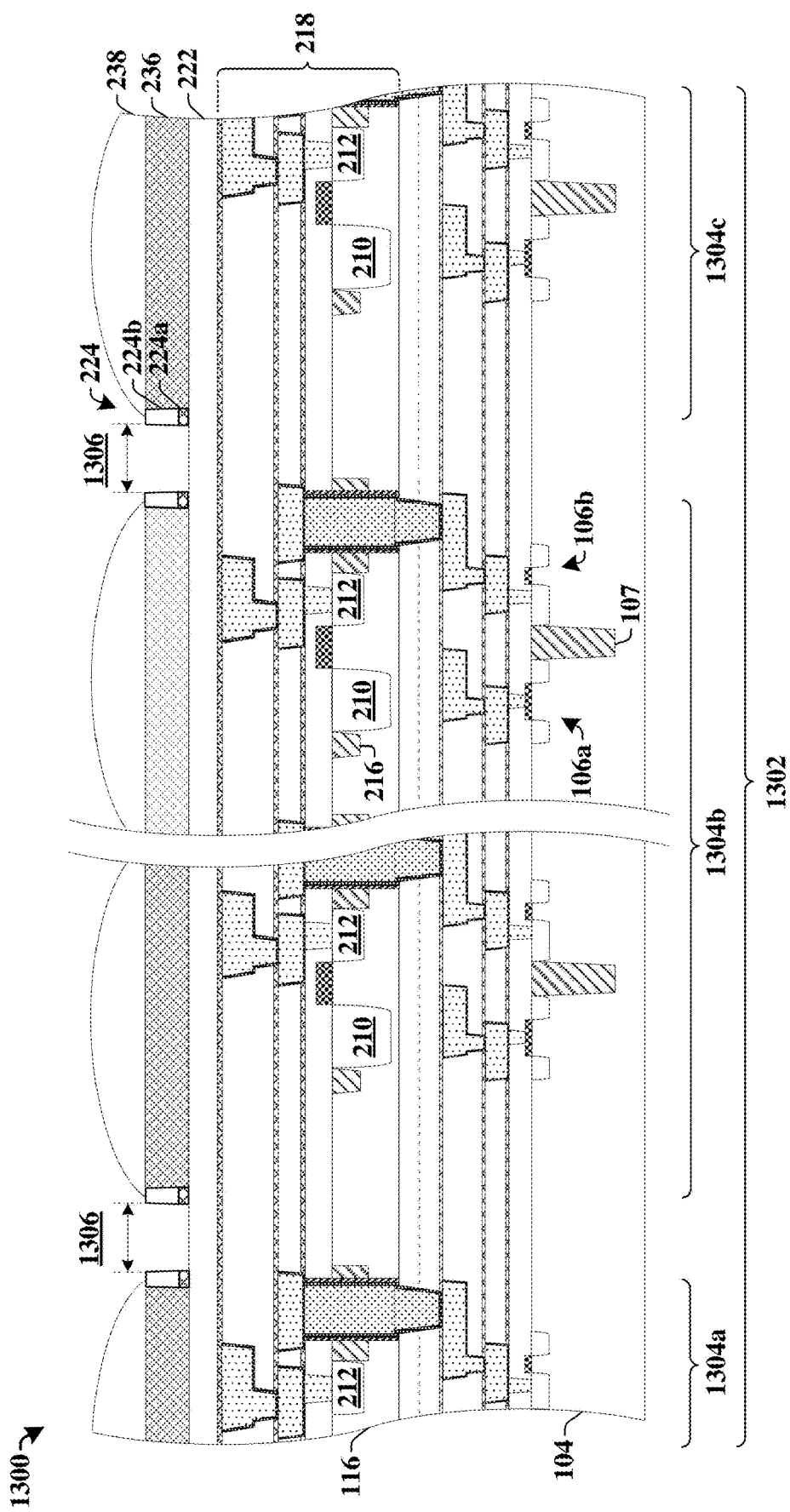

As shown in cross-sectional view 1300 of FIG. 13, a plurality of color filters 236 are formed over the second dielectric structure 218. In some embodiments, one or more passivation layers 222 may be formed over the second dielectric structure 218 prior to formation of the plurality of color filters 236. The plurality of color filters 236 may be formed within a grid structure 224 overlying the second dielectric structure 218. In some embodiments, the plurality of color filters 236 may be formed by forming a color filter layer and patterning the color filter layer. The color filter layer is formed of a material that allows for the transmission of radiation (e.g., light) having a specific range of wavelength, while blocking light of wavelengths outside of the specified range. The patterning may be performed by forming a photoresist layer with a pattern over the color filter layer, applying an etchant to the color filter layer according to the pattern of the photoresist layer, and removing the pattern photoresist layer. In some embodiments, the color filter layer is planarized subsequent to formation.

A plurality of micro-lenses 238 are subsequently formed over the plurality of color filters 236. In some embodiments, the micro-lenses 238 may be formed by depositing a micro-lens material above the plurality of color filters 236 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lenses 238 are then formed by selectively etching the micro-lens material according to the micro-lens template.

In some embodiments, the plurality of color filters 236 and the plurality of micro-lenses 238 are formed over a stacked wafer structure 1302, in which the first substrate 104 comprises a first wafer and the second substrate 116 comprises a second wafer (e.g., a thinned wafer). The stacked wafer structure 1302 comprises a plurality of die regions 1304a-1304c. Each of the plurality of die regions 1304a-1304c may comprise an image sensor array comprising a plurality of photodiodes 210 arranged in a periodic pattern. In some embodiments, an image sensing array within each of the plurality of die regions 1304a-1304c may comprise hundreds, thousands, or even more individual photodiodes 210. For example, although die region 1304b illustrates two photodiodes 210, it will be appreciated that the die region 1304b may comprise an image sensing array having more than two photodiodes. The die regions 1304a-1304c also respectively comprise a plurality of color filters 236 and micro-lenses 238 arranged in an array, such that a color filter 236 and a micro-lens 238 are positioned over an individual photodiode 210. The arrays of color filters 236 and micro-lenses 238 are laterally set back from edges of a die region, 1304a-1304c. The lateral set back causes adjacent arrays of color filters 236 and micro-lenses 238 to be laterally separated from one another by a non-zero space 1306.

Figure 14:
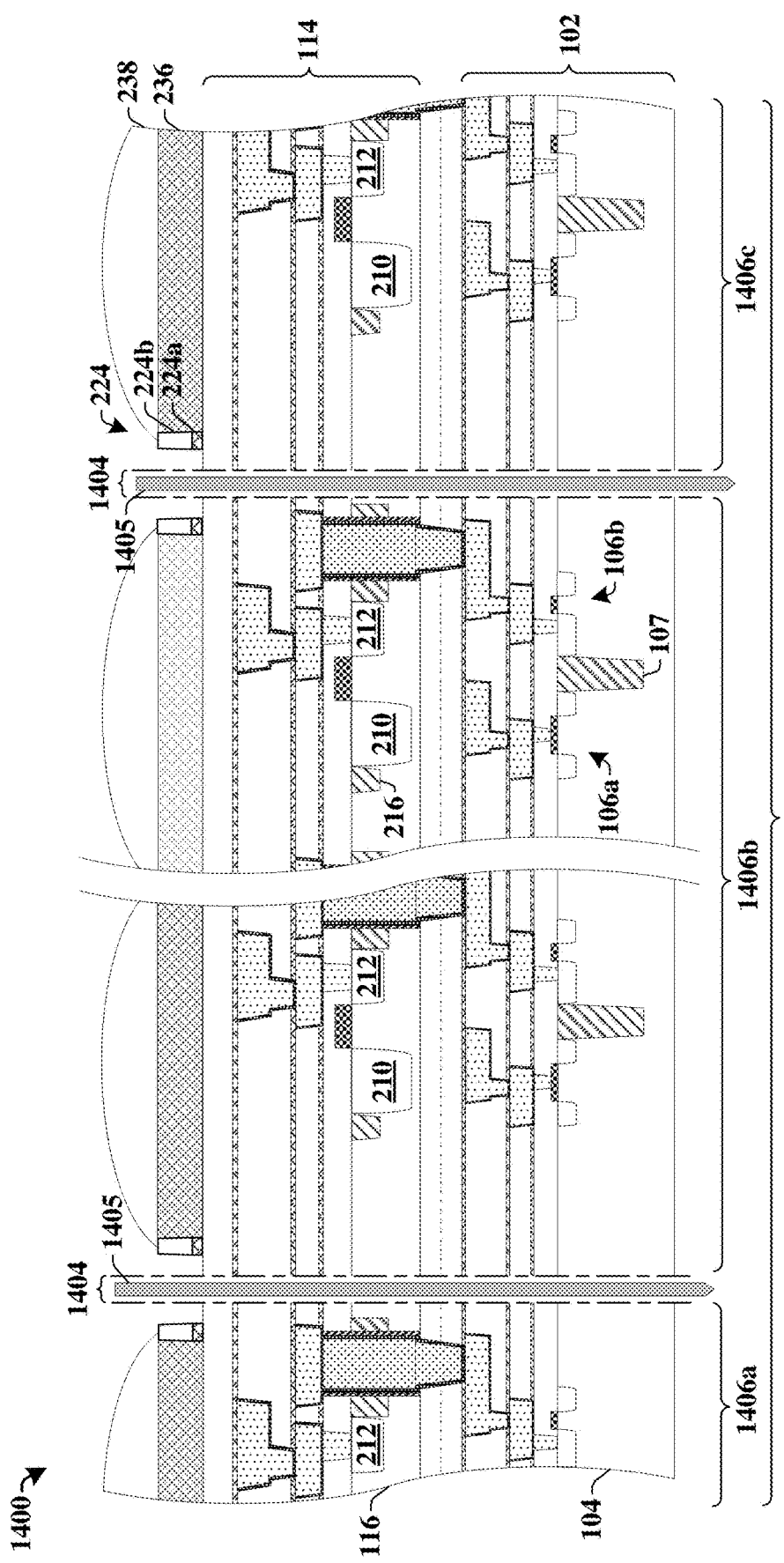

As shown in cross-sectional view 1400 of FIG. 14, in some embodiments, wherein the first substrate 104 comprises a first wafer (e.g., a first 300 mm wafer) and the second substrate 116 comprises a second wafer (e.g., a second 300 mm wafer), a dicing process is performed. The dicing process separates the stacked wafer structure 1402 into a plurality of separate die, 1406a-1406c, respectively having multiple tiers, 102 and 114. In some embodiments, the dicing process may be performed by way of a sawing process (e.g., using a saw blade 1405) along a scribe line 1404. In other embodiments, the dicing process may be performed by a laser along a scribe line 1404.

Figure 15:
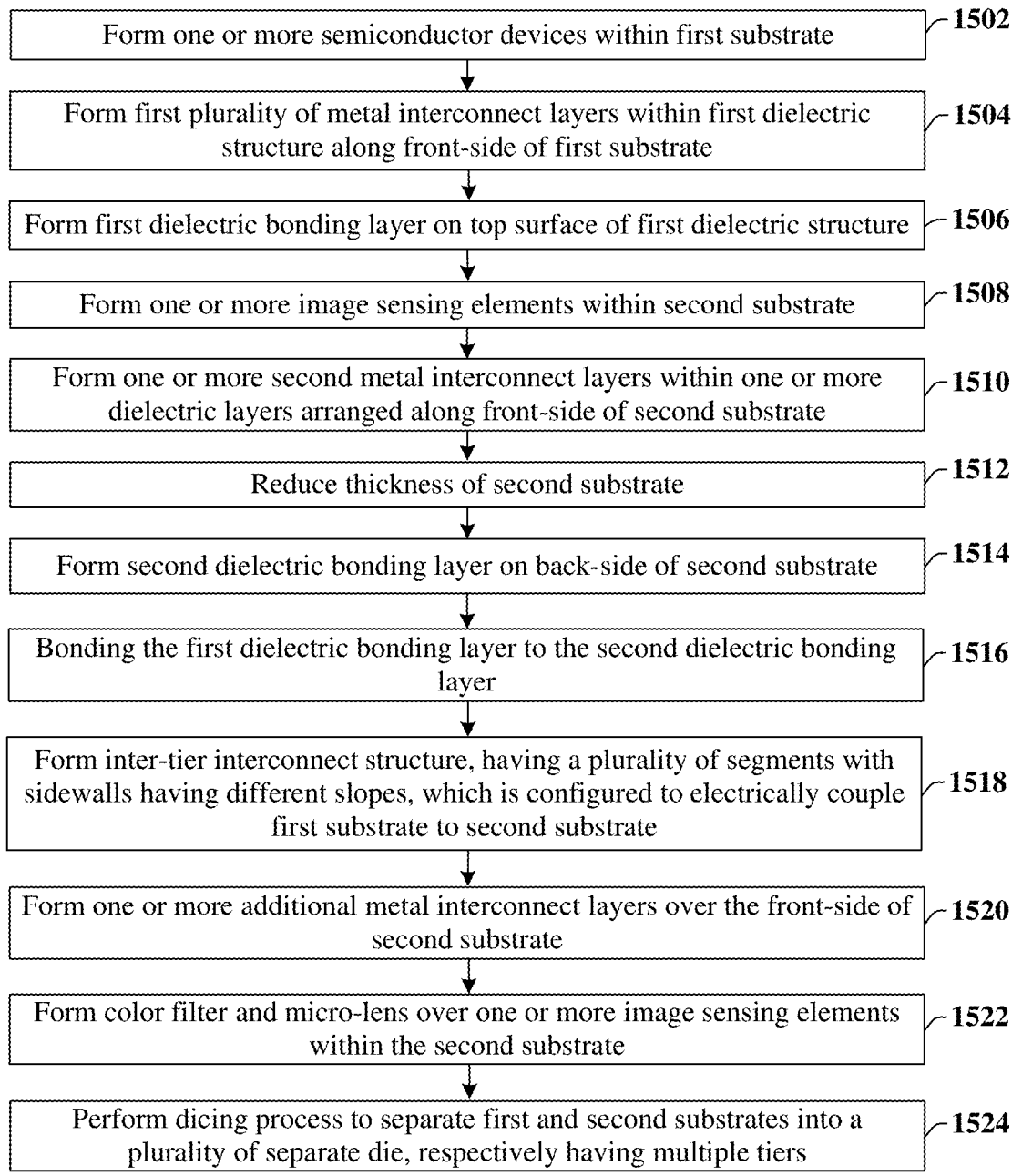
FIG. 15 illustrates a flow diagram of some embodiments of a method of forming a multi-dimensional integrated chip structure having tiers connected in a front-to-back configuration.

FIG. 15 illustrates a flow diagram of some embodiments of a method 1500 of forming a multi-dimensional integrated chip structure having tiers connected in a front-to-back configuration.

While the disclosed method 1500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, one or more semiconductor devices are formed within a first substrate. FIG. 5 illustrates some embodiments of a cross-sectional view 500 corresponding to act 1502.

At 1504, a first plurality of metal interconnect layers are formed within a first dielectric structure along a front-side of the first substrate. FIG. 6 illustrates some embodiments of a cross-sectional view 600 corresponding to act 1504.

At 1506, a first dielectric bonding layer is formed on a top surface of the first dielectric structure. FIG. 6 illustrates some embodiments of a cross-sectional view 600 corresponding to act 1506.

At 1508, one or more image sensing elements are formed within a second substrate. FIG. 7 illustrates some embodiments of a cross-sectional view 700 corresponding to act 1508.

At 1510, one or more second metal interconnect layers are formed within one or more dielectric layers dielectric structure arranged along a front-side of the second substrate. FIG. 8 illustrates some embodiments of a cross-sectional view 800 corresponding to act 1510.

At 1512, a thickness of the second substrate is reduced. FIG. 9 illustrates some embodiments of a cross-sectional view 900 corresponding to act 1512.

At 1514, a second dielectric bonding layer is formed on a back-side of the second substrate.

At 1516, the first dielectric bonding layer is bonded to the second dielectric bonding layer.

At 1518, an inter-tier interconnect structure is formed having a plurality of segments with sidewalls having different slopes. The inter-tier interconnect structure is configured to electrically coupled the first substrate to the second substrate.

At 1520, one or more additional metal interconnect layers may be formed over the front-side of second substrate, in some embodiments. FIGS. 10A-10E illustrate some embodiments of cross-sectional views corresponding to acts 1514-1520. FIGS. 11A-11E illustrate some alternative embodiments of cross-sectional views corresponding to acts 1514-1520. FIGS. 12A-12E illustrate some alternative embodiments of cross-sectional views corresponding to acts 1514-1520.

At 1522, one or more color filters and one or more micro-lenses are formed over the image sensing elements within the second substrate. FIG. 13 illustrates some embodiments of a cross-sectional view 1300 corresponding to act 1522.

At 1524, a dicing process is performed to separate the first and second substrates into a plurality of separate die, respectively having multiple tiers. FIG. 14 illustrates some embodiments of a cross-sectional view 1400 corresponding to act 1524.

Therefore, the present disclosure relates to a method of forming a multi-dimensional integrated chip having tiers connected in a front-to-back configuration, and an associated apparatus.

In some embodiments, the present disclosure relates to a method of forming a multi-dimensional integrated chip structure. The method comprises forming one or more semiconductor devices within a first substrate, and forming one or more image sensing elements within a second substrate. The method further comprises bonding a first dielectric structure over the first substrate to a back-side of the second substrate by way of a bonding structure. The method further comprises forming an inter-tier interconnect structure, comprising a plurality of different segments that respectively have sidewalls with different sidewall angles, which extends through the bonding structure and the second substrate. The inter-tier interconnect structure is configured to electrically couple a first metal interconnect layer over the first substrate to a second metal interconnect layer over the second substrate.

In other embodiments, the present disclosure relates to a method of forming a multi-dimensional integrated chip structure. The method comprises forming one or more semiconductor devices within a first substrate, forming a first plurality of metal interconnect layers within a first dielectric structure along a front-side of the first substrate, and forming a first dielectric bonding layer on a top surface of the first dielectric structure. The method further comprises forming one or more image sensing elements within a second substrate, forming one or more second metal interconnect layers within one or more dielectric layers arranged along a front-side of the second substrate, and forming a second dielectric bonding layer along a back-side of the second substrate. The method further comprises bonding the first dielectric bonding layer to the second dielectric bonding layer. The method further comprises forming an inter-tier interconnect structure, having a plurality of different segments with sidewalls having different slopes, which is configured to electrically couple the one or more semiconductor devices and the one or more image sensing elements.

In yet other embodiments, the present disclosure relates to a multi-dimensional integrated chip structure. The integrated chip structure comprises a first plurality of metal interconnect layers arranged within a first dielectric structure over a first substrate, and a second plurality of metal interconnect layers arranged within a second dielectric structure over a second substrate. A bonding structure is arranged between the first dielectric structure and the second substrate. An inter-tier interconnect structure extends between one of the first plurality of metal interconnect layers and one of the second plurality of metal interconnect layers and through the bonding structure and the second substrate. The inter-tier interconnect structure comprises a plurality of different segments that respectively have sidewalls with different sidewall angles.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip structure, comprising:
   a first plurality of interconnects within a first dielectric structure on a first substrate;
   a second plurality of interconnects within a second dielectric structure on a second substrate;
   a bonding structure arranged between the first dielectric structure and a surface of the second substrate facing the bonding structure; and
   an inter-tier interconnect structure extending between the first plurality of interconnects and the second plurality of interconnects and through the second substrate, wherein the inter-tier interconnect structure comprises a first region extending through the second substrate and a second region surrounded by the bonding structure, the second region having a trapezoidal shape with tapered sidewalls and contacting a lower surface of the first region that faces the first substrate.

2. The integrated chip structure of claim 1, further comprising:
   a diffusion barrier lining surfaces of the inter-tier interconnect structure, the diffusion barrier having surfaces that meet at a corner that is directly between sidewalls of the second substrate, the corner being a non-zero distance above the surface of the second substrate.

3. The integrated chip structure of claim 1, wherein the first region is laterally separated from the second substrate by a dielectric, the second region having a maximum width that is smaller than a maximum width of the first region, the second region vertically extending between top and bottom surfaces of the bonding structure.

4. The integrated chip structure of claim 1, wherein the first region has a first maximum width and the second region has a second maximum width that is less than the first maximum width.

5. The integrated chip structure of claim 1, wherein the second region has a width that increases as a distance from the first region increases.

6. The integrated chip structure of claim 1, wherein the inter-tier interconnect structure comprises a horizontally extending surface that is separated from one of the tapered sidewalls by an acute angle as measured outside of the inter-tier interconnect structure and as viewed in a cross-sectional view.

7. The integrated chip structure of claim 1,
   wherein the first region comprises a first conductive core and a first barrier arranged along sidewalls of the first conductive core; and
   wherein the second region comprises a second conductive core and a second barrier arranged along sidewalls and a horizontally extending surface of the second conductive core, the second barrier laterally separating the second conductive core from the bonding structure.

8. The integrated chip structure of claim 7, wherein the second barrier has sidewalls extending through the first barrier.

9. The integrated chip structure of claim 7, wherein the first conductive core is arranged along outer sidewalls of the second barrier.

10. The integrated chip structure of claim 1,
wherein the inter-tier interconnect structure further comprises a third region separated from the first region by the second region; and
wherein the tapered sidewalls of the second region extend along a first direction and the third region has second tapered sidewalls that extend along a different second direction that intersects the first direction.

11. The integrated chip structure of claim 1,
wherein the inter-tier interconnect structure further comprises a third region separated from the first region by the second region;
wherein the second region comprises a first conductive core and a first barrier arranged along sidewalls and a first horizontally extending surface of the first conductive core; and
wherein the third region comprises a second conductive core and a second barrier arranged along sidewalls and a second horizontally extending surface of the second conductive core.

12. The integrated chip structure of claim 11, wherein the second barrier has a third horizontally extending surface contacting a part of a fourth horizontally extending surface of the first conductive core, the fourth horizontally extending surface facing the first substrate.

13. An integrated chip structure, comprising:
a first plurality of interconnects within a first dielectric structure on a first substrate;
a second plurality of interconnects within a second dielectric structure on a second substrate;
a dielectric bonding structure arranged between the first substrate and the second substrate;
an interconnect structure extending between the first plurality of interconnects and the second plurality of interconnects and through the dielectric bonding structure and the second substrate, wherein the interconnect structure has a width that increases as distances from opposing sides of the dielectric bonding structure increase; and
wherein the interconnect structure comprises a first segment having a first tapered sidewall extending along a first direction and a second segment having a second tapered sidewall extending along a second direction that is different than the first direction, the first segment and the second segment disposed between sidewalls of the dielectric bonding structure.

14. The integrated chip structure of claim 13, wherein the first segment has a surface facing the second segment, the surface laterally extending past an outermost sidewall of the second segment.

15. The integrated chip structure of claim 13,
wherein the first segment comprises a first conductive core and a first barrier arranged along sidewalls and a first horizontally extending surface of the first conductive core; and
wherein the second segment comprises a second conductive core and a second barrier arranged along sidewalls and a second horizontally extending surface of the second conductive core.

16. An integrated chip structure, comprising:
a first plurality of interconnects within a first dielectric structure on a first substrate;
a second plurality of interconnects within a second dielectric structure on a second substrate;
an interconnect structure electrically connecting the first plurality of interconnects and the second plurality of interconnects and extending through the second substrate; and
wherein the interconnect structure comprises a first sidewall extending through the second substrate and coupled to a tapered second sidewall by a horizontally extending surface of the interconnect structure, the horizontally extending surface facing the first substrate.

17. The integrated chip structure of claim 16, wherein the horizontally extending surface is directly between sidewalls of the second substrate.

18. The integrated chip structure of claim 16, further comprising:
a dielectric bonding structure arranged between the first substrate and the second substrate;
wherein the interconnect structure comprises a first segment laterally surrounded by the second substrate and a second segment laterally surrounded by the dielectric bonding structure, the horizontally extending surface being laterally outside of the second segment.

19. The integrated chip structure of claim 16, further comprising:
a dielectric bonding structure arranged between the first substrate and the second substrate;
wherein the interconnect structure comprises a first segment laterally surrounded by the second substrate, a second segment laterally surrounded by the dielectric bonding structure, and a third segment laterally surrounded by the dielectric bonding structure; and
wherein the second segment and the third segment respectively comprise a barrier surrounding a core, the barrier of the second segment and the third segment continuously extending around the core of the second segment and the third segment.

20. The integrated chip structure of claim 16, wherein the tapered second sidewall is coupled to a bottom surface of the interconnect structure, the bottom surface physically contacting a top surface of the first plurality of interconnects that is substantially planar with a top surface of the first dielectric structure.

* * * * *